United States Patent [19]
Matsushita et al.

[11] 3,977,019
[45] Aug. 24, 1976

[54] SEMICONDUCTOR INTEGRATED CIRCUIT
[75] Inventors: Takeshi Matsushita, Sagamihara; Yoshiyuki Kawana, Atsugi, both of Japan
[73] Assignee: Sony Corporation, Tokyo, Japan
[22] Filed: May 14, 1974
[21] Appl. No.: 469,841

[30] Foreign Application Priority Data
May 14, 1973   Japan.............................. 48-53432

[52] U.S. Cl. .................................. 357/48; 357/46; 357/52; 357/59; 357/91
[51] Int. Cl.² ................. H01L 27/04; H01L 27/02; H01L 29/34; H01L 29/04
[58] Field of Search ................... 357/46, 48, 52, 57, 357/59, 91

[56] References Cited
UNITED STATES PATENTS
3,725,150   4/1973   George ............................. 357/59

OTHER PUBLICATIONS

IBM – Tech. Bul., vol. 13, No. 5, Oct. 1970, Kemlage "Prevention of Metal to Base Shorting".

Primary Examiner—Edward J. Wojciechowicz
Attorney, Agent, or Firm—Hill, Gross, Simpson, Van Santen, Steadman, Chiara & Simpson

[57]   ABSTRACT

A semiconductor integrated circuit, in which an isolation region with one conductivity type and a plurality of island regions with another conductivity type separated by the isolation region are provided, is disclosed. In this case, a high resistance polycrystalline semiconductor layer is formed to cover whole of a surface portion of a PN-junction formed between the isolation region and the island regions.

4 Claims, 6 Drawing Figures

SEMICONDUCTOR INTEGRATED CIRCUIT

BACKGROUND OF THE INVENTION

1. Field of the Invention

The present invention relates generally to a semiconductor integrated circuit, and more particularly is directed to a semiconductor integrated circuit with high withstanding voltage and stable and reliable characteristics.

2. Description of the Prior Art

There is proposed a semiconductor integrated circuit in which an isolation region of, for example, P-type conductivity is formed in a semiconductor base, a plurality of regions of N-type conductivity are divided in islands by the P-type isolation region, circuit elements are formed on each of the islands, respectively, and these islands are electrically isolated by PN-junctions formed between the islands and the isolation region. In this case, if an insulating layer made of, for example, silicon dioxide $SiO_2$ is formed on the surface of the PN-junction for isolation extending to the surface of the substrate, an integrated circuit which may be high in withstanding voltage and in reliability can not be obtained. The integrated circuit of the prior art mentioned just above will be now described with reference to FIG. 1 in which two PNP-type transistors are formed on a common semiconductor substrate with their collectors being common. In the prior integrated circuit shown in FIG. 1, a semiconductor substrate 1 with high impurity concentration of P-type conductivity or low resistivity is prepared, a semiconductor layer 2 with relatively low impurity concentration of P-type conductivity is formed on the substrate 1 by an epitaxial method, and a semiconductor layer 3 with relatively low impurity concentration of N-type conductivity is also epitaxially formed on the layer 2 to form a semiconductor base 4. An insulating layer 5 made of, for example, silicon dioxide $SiO_2$ is formed on an upper surface 4a of the semiconductor base 4 and a window 5c is then formed in the insulating layer 5 by photoetching. Through the window 5c, an impurity of P-type conductivity is selectively diffused into the semiconductor layer 3 to such an extent that the P-type impurity passes through the semiconductor layer 3 of N-type to form an isolation region 6 of P-type. Thus, the semiconductor layer 3 is divided into a plurality of regions by the isolation region 6 or two island regions 7a and 7b. In this case, upon the formation of the isolation region 6 by diffusion, an oxide layer or region insulating layer 5' is formed on the isolation regin 6 at the position of the window 5c to close the latter. A P-type impurity is selectively diffused into the respective island regions 7a and 7b to form P-type regions 8a and 8b. Thus, two PNP-type transistors 9a and 9b are formed respectively which have their common collector region made of the P-type substrate 1 and the semiconductor layer 2, their base regions made of the island regions 7a and 7b consisting of the N-type semiconductor 3 and isolated by the isolation region 6, and their emitter regions made of the P-type regions 8a and 8b.

With the integrated circuit described as above, the PN-junction J formed between the isolation region 6 and the island regions 7a and 7b electrically isolates the respective island regions 7a and 7b or the base regions of the transistors 9a and 9b, but it is ascertained that the withstanding voltage of the PN-junction J is relatively low and unstable. The low withstanding voltage and unstableness of the PN-junction J are caused by the fact that a positive surface level $Q_{SS}$ appears on the surface 4a of the base 4 due to the layer 5 of $SiO_2$ and the surface portion of the isolation region 6 is partially reversed to the N-type by the positive surface level $Q_{SS}$, as shown in FIG. 2, to form reverse regions 10 which extend from the islands or base regions 7a and 7b of the transistors 9a and 9b to the inside of the isolation region 6. In other words, the formation of the reverse regions 10 curves the PN-junction J near its surface portion to make its curvature large, so that its withstanding voltage is lowered by applying great electric field locally.

Further, since the isolation region 6 is formed by diffusion of the P-type impurity through the window 5c as described previously, the impurity concentration in the isolation region 6 near the surface 4a becomes high as it reaches the window 5c. Accordingly, PN-junctions J' formed by the reverse regions 10 near their end portions, which extend to the inside of the isolation region 6, are formed in the portion of the isolation region 6 in its high impurity concentration, so that the extension of the depletion layer in this portion is small when a reverse bias is applied to the PN-junction J', and hence the intensity of electric field applied thereto becomes great to lower its withstanding voltage.

Further, in the case where a wiring 11 made of conductive layer for electrically connecting the emitter of the transistor 9a with the base of the other transistor 9b is formed on the insulating layer 5 as shown in FIGS. 1 and 2, when a positive voltage is applied to the wiring 11, the formation of the reverse layer 10 is further increased by this positive voltage in addition to the surface level $Q_{SS}$.

If the semiconductor pellet forming the integrated circuit is covered with resin mold to be protected, polarization is produced in the resin by some reasons to promote the formation of the reverse layer 10. By way of example, since the isolation region 6 is electrically connected to the common collector region of the transistors 9a and 9b in the example of FIGS. 1 and 2, the characteristic relationship between a reverse bias voltage $V_{CB}$ across the collector-base of the transistors 9a and 9b and their collector-base current $I_{CB}$ is shown in FIG. 3 by a solid line which shows that the current $I_{CB}$ becomes large for relatively low reverse bias to the collector junction. Further, this characteristic is fluctuated up and down as indicated by arrows in FIG. 3. This fluctuation may be caused by, for example, changes of voltage applied to the wiring 11. In order to increase the withstanding voltage across the collector-base of the transistors and to obtain an ideal characteristic shown by a dotted line in FIG. 3, it is necessary to improve the withstanding voltage of the PN-junction and the stabilization or reliability of the isolation region 6.

In order to improve the withstanding voltage and reliability of the isolation region, such a construction shown in FIG. 4 is proposed in which a polycrystalline silicon layer 14 with high resistance, for example, with the resistivity of $2.5 \times 10^4$ $\Omega$cm is formed through the insulating layer 5 all over the surface 4a of the semiconductor base 4 in a range to which the PN-junction J formed by the isolation region 6 extends, and the polycrystalline layer 14 is made to be in ohmic contact at its both sides with the region 6 and the regions 7a and 7b over the junction J.

With this construction, the withstanding voltage can be made high as compared with that of the previously mentioned prior art one. That is, in an integrated circuit in which an isolation region is provided to achieve isolation by its PN-junction, since the PN-junction is always supplied with a reverse bias for the isolation, the polycrystalline silicon layer 14 of high resistance is supplied with voltage applied to the regions 6, 7a and 7b at the both sides of the silicon layer 14 gripping the PN-junction J, so that voltage gradient appears in the silicon layer 14 across the PN-junction. If a voltage of −100V (volts) is applied to the region 6 and a voltage of OV is applied to the regions 7a and 7b, by way of example, the voltage gradient of −100 to OV appears in the high resistance silicon layer 14. Accordingly, a negative voltage is applied to the junction J near its surface by the high resistance silicon layer 14 and hence the surface level $Q_{SS}$ is canceled to suppress the formation of the reverse layer. Further, the voltage gradient appeared in the high resistance silicon layer 14 acts to have a slow voltage gradient applied to the junction J extended to the surface 4a, so that the expansion of the depletion layer of the junction J can be slow in curvature to make gentle the concentration of electric field and hence to increase the withstanding voltage of the junction J as shown in FIG. 4 by a dotted line $J_d$.

With the last prior art mentioned example, the withstanding voltage thereof can be increased as compared with that of the former example and the characteristic can be stabilized. However, in this second example, due to the voltage gradient produced in the silicon layer 14 of high resistance, a voltage of, for example, −80V indicated in FIG. 4 is applied to the surface portion of the junction J, and consequently a positive voltage of −80V − (−100)V = +20V is still applied to the same portion through the insulating layer 5, so that the withstanding voltage can not be improved sufficiently.

SUMMARY OF THE INVENTION

According to the present invention, there is obtained a semi-conductor integrated circuit in which a plurality of island regions with one conductivity type are isolated by an isolation region with another conductivity type and in which a high resistance polycrystalline semiconductor layer is formed on the whole surface on the PN-junction formed between the isolation region and the island regions.

Accordingly, it is an object of the present invention to provide a semiconductor integrated circuit free from the defects encountered in the prior art.

It is another object of the invention to provide a semiconductor integrated circuit with high withstanding voltage.

It is a further object of the invention to provide a semiconductor integrated circuit which is stable and reliable in characteristics.

The additional and other objects, features and advantages of the invention will become apparent from the following description taken in conjunction with the accompanying drawings in which like reference numerals and symbols indicate like elements.

DESCRIPTION OF THE PREFERRED EMBODIMENT

Figure 5:
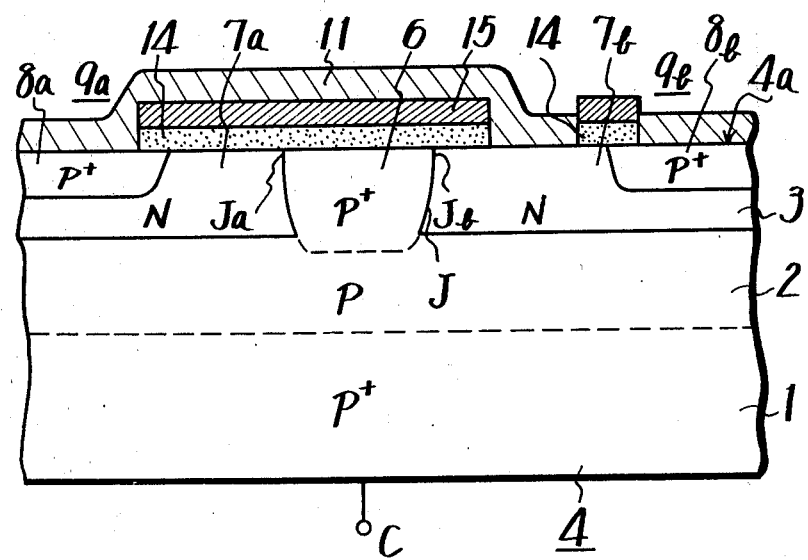
FIG. 5 is a cross-sectional view of the semiconductor integrated circuit according to the present invention.

An embodiment of the present invention will be hereinafter described with reference to FIG. 5. In the embodiment of FIG. 5, two PNP-type transistors 9a and 9b are connected in a Darlington manner with their collectors being common in an integrated circuit. In the embodiment of the invention shown in FIG. 5, the two transistors 9a and 9b are formed by the method same as that described in connection with FIG. 1. That is, a semiconductor substrate of P-type conductivity and with low resistivity, for example, a silicon substrate 1, which may be a region for a collector terminal C, is prepared, a silicon semiconductor layer 2 of P-type conductivity and relatively low impurity concentration is formed on the silicon substrate 1 by an epitaxial method, and then a semiconductor layer, for example, a silicon semiconductor layer 3 of N-type conductivity and relatively low impurity concentration is formed on the silicon semiconductor layer 2 by an epitaxial method to form a silicon semiconductor base 4. An insulating layer 5 (not shown in FIG. 5) made of such as silicon dioxide $SiO_2$ is formed on whole of an upper surface 4a of the semiconductor base 4. A window (not shown in FIG. 5) is bored through the insulating layer 5 by photo-etching method, and a P-type impurity is diffused through the window into the layer 3 selectively to form an isolation region 6 which passes through the layer 3. The isolation region 6 divides the semiconductor layer 3 into plural portions to provide two island regions 7a and 7b. Windows (not shown) are also bored through the insulating layer 5 at the positions corresponding to the respective island regions 7a and 7b, and a P-type impurity is selectively diffused through the windows into the layer 3 with the insulatig layer 5 as a mask to form P-type regions 8a and 8b in the layer 3, respectively. Thus, two PNP-type transistors 9a and 9b are formed respectively which have the collector regions of the P-type substrate 1 and the P-type semiconductor layer 2 in common, the base regions of the island regions 7a and 7b isolated by the isolation region 6 and consisting of the N-type semiconductor layer 3, and the emitter regions of the P-type regions 8a and 8b.

With the present invention, the insulating layer 5 lying on the portion of the surface 4a, to which the PN-junctions formed by the isolation region 6, especially their surface portions $J_a$ and $J_b$ face between the island regions 7a and 7b, is eliminated by the photo-etching method, and in that place a high resistance polycrystalline semiconductor layer such as a high resistance polycrystalline silicon layer 14 is completely formed. In the illustrated embodiment, the high resistance polycrystalline silicon layer 14 is also formed on the emitter junction of the both transistors 9a and 9b. An insulating layer 15 made of such as silicon dioxide $SiO_2$ is formed on whole of the high resistance polycrystalline layer 14. The high resistance polycrystalline layer 14 and the insulting SiO₂ layer 15 are continuously formed in the same reaction furnace by the CVD (Chemical Vapor Deposition) method. Firstly, the polycrystalline silicon layer 14 with, for example, $2.5 \times 10^4$ Ωcm of resistivity is formed with the thickness of 5000 to 10000 A (Angstroms), and then the SiO₂ layer 15 is formed on the silicon layer 14 with the thickness of about 1 micron without removing the base 4 from the reaction furnace by changing the vapor fed to the reaction furnace. After the formation of the SiO₂ layer 15 on the silicon layer 14, the layers 14 and 15 are subjected to the photo-etching process to remove their unnecessary portions.

Figure 6:
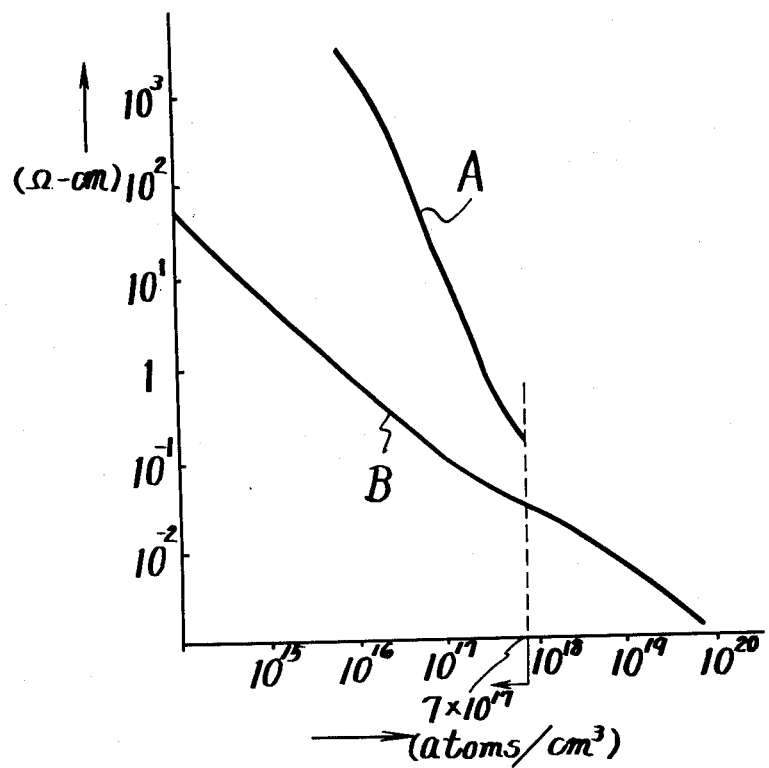
FIG. 6 is a graph showing the relationship between the resistivity and impurity concentration of the embodiment shown in FIG. 5.

The resistivity of the polycrystalline silicon layer 14 can be made to be about $2.5 \times 10^4$ Ωcm as mentioned above by selecting the impurity concentration low. In FIG. 6, reference symbol A shows the impurity concentration of the polycrystalline silicon layer with arsenic $A_s$ as impurity to its resistivity characteristic, and reference symbol B the similar characteristic of single crystal silicon. As may be apparent from the characteristics, when the impurity concentration of the polycrystalline silicon becomes lower than $7 \times 10^{17}$ atoms/cm³, it resistivity becomes much high as compared with that of the single crystal silicon.

A wiring 11 made of conductive layer is formed between, for example, the emitter 8a of the transistor 9a and the base 7b of the transistor 9b lying on the high resistance phlycrystalline silicon layer 14 and the insulating layer 15 and connecting the same.

Figure 4:
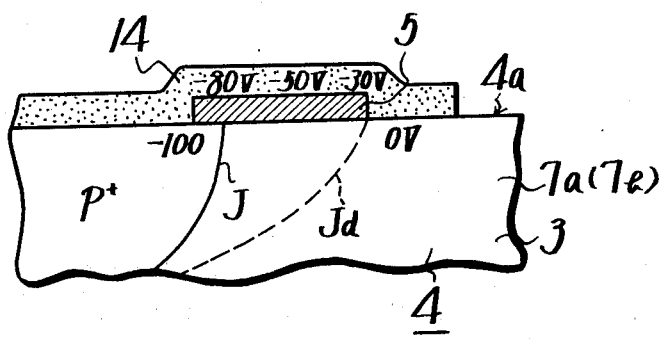
FIG. 4 is a schematic cross-sectional view of another conventional integrated circuit.

With the integrated circuit of the present invention formed as above, the high resistance polycrystalline silicon layer 14 is directly formed on the surface 4a of the base 4 including the surface of the PN-junction formed by the isolation region 6 and the vicinity thereof, so that there is no surface level $Q_{SS}$ on the surface 4a of the base 4 and hence no reverse layer is formed at all thereby with the result that the withstanding voltage across the junction J is not lowered. Further, since there is no insulating layer between the high resistance polycrystalline silicon layer 14 and the semiconductor base 4, the voltage described in connection with FIG. 4 is prevented from being applied and hence the withstanding voltage is improved much.

In addition, due to the high resistance layer 14, any effect of the voltage applied to the wiring 11 on the surface 4a of the base 4 can be prevented to make the integrated circuit stable and reliable in characteristics.

Figure 1:
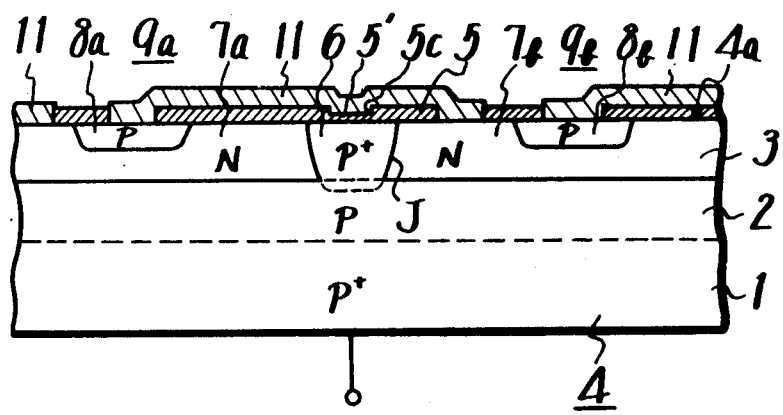
FIG. 1 is a cross-sectional view of a conventional integrated circuit.
Figure 2:
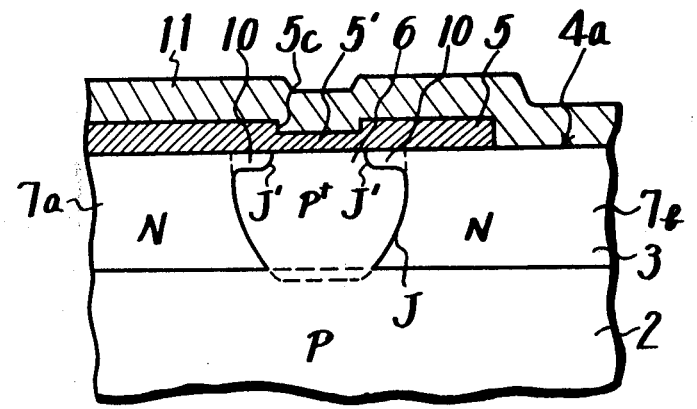
FIG. 2 is a cross-sectional view of a part of FIG. 1 in enlarged scale.
Figure 3:
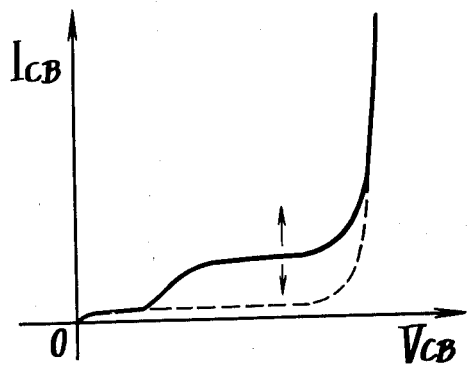
FIG. 3 is a graph showing characteristics of the example shown in FIG. 1.

In the prior art integrated circuit shown in FIG. 1, the withstanding voltage ($V_{CBO}$ across the base-collector of the transistors 9a and 9b is 120V with the emitter being opened, and the withstanding voltage $V_{CEO}$ across the collector-emitter with the base being opened is 90V with the base being opened. While, in the integrated circuit of the present invention, the $V_{CBO}$ is 190V and $V_{CEO}$ is 150V, respectively.

Further, it is ascertained that the integrated circuit of the invention is now lowered in withstanding voltage and shows stable characteristics after it is subjected to a so-called BT treatment under high bias and high temperature.

Further, it is also ascertained that when the integrated circuit has provided with the insulating layer 15 such as SiO₂ on the high resistance polycrystalline layer 14, the above characteristics are made much stable. The reason may be that if resin mold is coated on the surface of the integrated circuit for protection thereof, the insulating layer may prevent the passage of ions and so on in the resin. Further, when the SiO₂ layer 15 is provided, the adhesion of internal wirings such as the wiring 11 on the SiO₂ layer 15 can be enhanced.

In the above embodiment, the isolation region 6 is of P-type conductivity and the regions 7a and 7b, which are isolated by the isolation region 6, are of N-type conductivity, but it may be apparent that the present invention can be applied to the case where the isolation region and the isolated regions are different from the above case in conductivity type.

It may be apparent that many modifications and variations could be effected by those skilled in the art without departing from the spirits and scope of the novel concepts of the present invention.

What is claimed is:

1. A semiconductor integrated circuit comprising:
   a. a substrate of first conductivity type;
   b. a first island region of second conductivity type formed on said substrate and having a first voltage potential applied thereto;
   c. a second island region of second conductivity type formed on said substrate and having a second voltage potential applied thereto;
   d. an isolation region of first conductivity type between said first and second regions and having first and second interfaces therewith, first and second PN junctions being formed by said first and second interfaces, respectively; and
   e. a polycrystalline resistance layer doped to achieve a predetermined resistance sufficient to suppress formation of a reverse region in the isolation region, said resistance region being continuously formed in contact with said first and second island regions, isolation region, and first and second PN junctions to create a voltage gradient across said resistance layer due to said first and second voltage potentials.

2. The integrated circuit of claim 1 in which said polycrystalline semiconductor resistance layer has a resistivity of $2.5 \times 10^4$ ohm cm.

3. A semiconductor integrated darlington circuit comprising:
   a. a substrate of first conductivity type as a common collector;
   b. a first island region as a first base of second conductivity type formed on said substrate and having a first voltage potential applied thereto;
   c. a first emitter region of first conductivity type formed in said first island region;
   d. a second island region as a second base of second conductivity type formed on said substrate and having a second voltage potential applied thereto;
   e. a second emitter region of first conductivity type formed in said second island region;
   f. an isolation region of first conductivity type between said first and second regions and having first and second interfaces therewith, first and second PN junctions being formed by said first and second interfaces, respectively;
   g. a polycrystalline resistance layer doped to achieve a predetermined resistance sufficient to suppress formation of a reverse region in the isolation region, said resistance layer being continuously formed in contact with said first and second island region, isolation region, and first and second PN junctions to create a voltage gradient across said resistance layer due to said first and second voltage potentials;

h. an insulating layer over said resistance layer; and i. a metal layer over said insulating layer, said metal layer being connected to said first emitter and second base.

4. The circuit of claim 3 in which a polycrystalline resistance layer is formed in contact over a PN junction between said first emitter region and first island region and a PN junction between said second emitter region and second island region.

* * * * *